(12) United States Patent
Harazono et al.

(10) Patent No.: US 8,957,321 B2
(45) Date of Patent: Feb. 17, 2015

(54) PRINTED CIRCUIT BOARD, MOUNT STRUCTURE THEREOF, AND METHODS OF PRODUCING THESE

(71) Applicant: KYOCERA SLC Technologies Corporation, Yasu-shi, Shiga (JP)

(72) Inventors: Masaaki Harazono, Yasu (JP); Yoshihiro Hosoi, Yasu (JP)

(73) Assignee: KYOCERA SLC Technologies Corporation, Shiga (JP)

( * ) Notice: Subject to any disclaimer, the term of this patent is extended or adjusted under 35 U.S.C. 154(b) by 253 days.

(21) Appl. No.: 13/627,813

(22) Filed: Sep. 26, 2012

(65) Prior Publication Data

US 2013/0081861 A1    Apr. 4, 2013

(30) Foreign Application Priority Data

Sep. 26, 2011  (JP) ................................. 2011-209863
Oct. 27, 2011  (JP) ................................. 2011-235659

(51) Int. Cl.

| H05K 1/16 | (2006.01) |
|---|---|
| H05K 1/03 | (2006.01) |
| H05K 3/10 | (2006.01) |
| H05K 3/00 | (2006.01) |
| H05K 3/42 | (2006.01) |
| H05K 3/46 | (2006.01) |

(52) U.S. Cl.
CPC .............. *H05K 1/0306* (2013.01); *H05K 3/107* (2013.01); *H05K 1/0366* (2013.01); *H05K 3/0044* (2013.01); *H05K 3/427* (2013.01); *H05K 3/4644* (2013.01); *H05K 2201/0209* (2013.01); *H05K 2201/0959* (2013.01); *H05K 2201/10674* (2013.01); *H05K 2203/025* (2013.01); *H01L 2224/16225* (2013.01)

USPC ........... 174/260; 174/255; 174/256; 174/262; 174/264; 428/15; 428/196; 428/209; 257/700; 29/830

(58) Field of Classification Search
USPC ............ 174/260, 255, 256, 262, 264; 428/15, 428/196, 209; 257/700; 29/830
See application file for complete search history.

(56) References Cited

U.S. PATENT DOCUMENTS

| 3,775,074 | A | * | 11/1973 | Russell ............................ 65/470 |
|---|---|---|---|---|
| 7,521,799 | B2 | | 4/2009 | Hayashi et al. |
| 7,791,204 | B2 | | 9/2010 | Hayashi et al. |
| 8,018,066 | B2 | | 9/2011 | Hayashi et al. |
| 8,319,111 | B2 | * | 11/2012 | Saiki et al. ..................... 174/255 |
| 2004/0151882 | A1 | * | 8/2004 | Tani et al. ...................... 428/209 |
| 2005/0218503 | A1 | * | 10/2005 | Abe et al. ....................... 257/700 |

(Continued)

FOREIGN PATENT DOCUMENTS

| JP | 2003-209359 A | 7/2003 |
|---|---|---|
| JP | 2006-324642 A | 11/2006 |

(Continued)

*Primary Examiner* — Xiaoliang Chen
(74) *Attorney, Agent, or Firm* — Procopio, Cory, Hargreaves & Savitch LLP

(57) ABSTRACT

A printed circuit board of the present invention includes a base body, a through-hole that penetrates through the base body in the thickness direction, and a through-hole conductor that covers an inner wall of the through-hole. The base body has a fiber layer including a plurality of glass fibers and a resin that covers the plurality of glass fibers. The glass fibers have a groove-shaped concavity on a surface exposed to the inner wall of the through-hole. The concavity is filled with a part of the through-hole conductor.

15 Claims, 6 Drawing Sheets

(56) References Cited

U.S. PATENT DOCUMENTS

| | | |
|---|---|---|
| 2006/0244128 A1 | 11/2006 | Hayashi et al. |
| 2007/0186414 A1* | 8/2007 | Abe et al. .................. 29/830 |
| 2009/0174065 A1 | 7/2009 | Hayashi et al. |
| 2010/0018758 A1* | 1/2010 | Yoshimura et al. ........... 174/256 |
| 2010/0187679 A1 | 7/2010 | Hayashi et al. |
| 2011/0269273 A1 | 11/2011 | Hayashi et al. |
| 2012/0133045 A1 | 5/2012 | Hayashi et al. |

FOREIGN PATENT DOCUMENTS

| | | |
|---|---|---|
| JP | 2009-283958 A | 3/2009 |
| JP | 4534062 B2 | 9/2010 |

* cited by examiner

FIG. 4B

| Evaluation items | methods | pitch of the through-holes | | | | | |
|---|---|---|---|---|---|---|---|
| | | 100 | 110 | 120 | 130 | 140 | 150 |
| PCBT (130°C/85%RH/5V/hours) | drilling | NG | OK | OK | OK | OK | OK |
| | sandblast | OK | OK | OK | OK | OK | OK |
| THB (85°C/85%RH/5V/hours) | drilling | NG | NG | OK | OK | OK | OK |
| | sandblast | OK | OK | OK | OK | OK | OK |

FIG.5

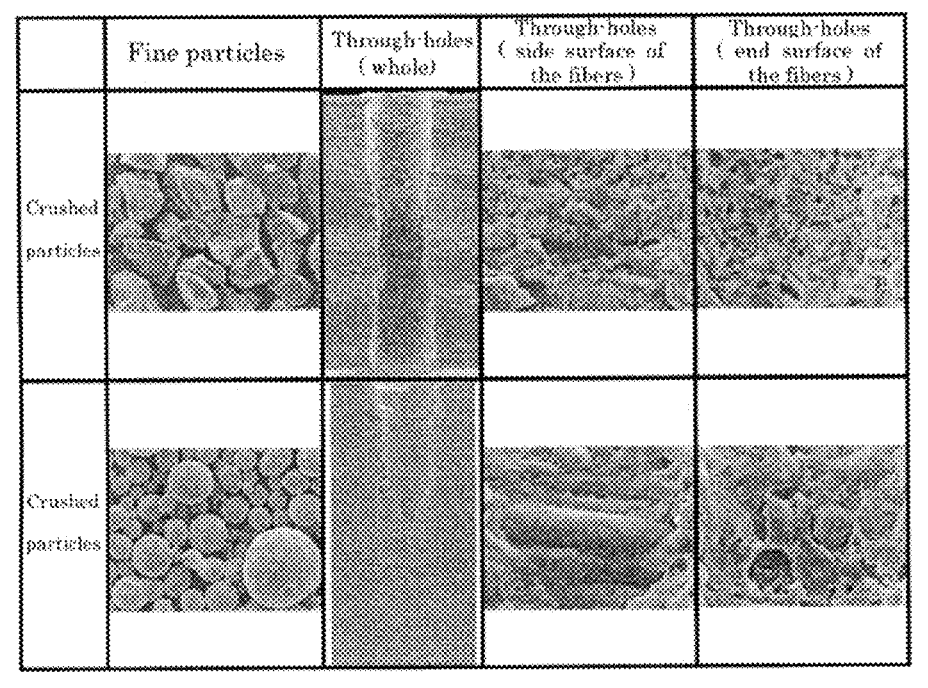

| | Fine particles | Through-holes (whole) | Through-holes (side surface of the fibers) | Through-holes (end surface of the fibers) |
|---|---|---|---|---|
| Crushed particles | | | | |
| Crushed particles | | | | |

PRINTED CIRCUIT BOARD, MOUNT STRUCTURE THEREOF, AND METHODS OF PRODUCING THESE

BACKGROUND OF THE INVENTION (1) Field of the Invention

The present invention relates to a printed circuit board and amount structure thereof used in electronic apparatus (for example, various audio-visual apparatus, home electronic apparatus, communication apparatus, computer apparatus, and peripheral apparatus thereof) and others, as well as a method of producing these.

(2) Description of the Related Art

Conventionally, as a mount structure in an electronic apparatus, a mount structure in which an electronic component is mounted on a printed circuit board is used.

JP 2006-324642 A discloses a printed circuit board in which a through-hole is formed by performing a drilling treatment on a core substrate including a layer obtained by impregnating glass cloth with an insulating resin and solidifying it in a plate shape, and a through-hole via (through-hole conductor) made of Cu or the like is formed by the plating method or the like on the side wall of the through-hole.

Also, JP 2003-209359 A discloses a printed circuit board in which a through-hole is formed by a laser treatment in a core substrate made of an epoxy resin or the like and reinforced by glass cloth, and the inside of the through-hole is filled with an electrically conductive paste.

By the way, when the heat generated at the time of mounting or operating an electronic component is applied to the printed circuit board, a heat stress is liable to be generated between the glass cloth exposed to the inner wall of the through-hole and the through-hole conductor due to the difference in coefficient of thermal expansion between the glass cloth and the through-hole conductor. In particular, when a through-hole is formed in a core substrate by a drilling treatment, the surface of the glass cloth exposed to the inner wall of the through-hole is liable to be smooth, so that the through-hole conductor is liable to be exfoliated from the inner wall of the through-hole by the above-described heat stress.

Also, when a through-hole is formed in the core substrate by a drilling treatment, exfoliation between the glass cloth and the resin is liable to occur on the inner wall of the through-hole by mechanical stress or frictional heat. On the other hand, when a through-hole is formed in the core substrate by a laser treatment, exfoliation between the glass cloth and the resin is liable to occur on the inner wall of the through-hole by the heat of the laser.

In this manner, when exfoliation occurs between the glass cloth and the resin on the inner wall of the through-hole, there is a fear that, when a voltage is applied to the through-hole conductor, a part of the through-hole conductor that has been ionized by the voltage penetrates into the exfoliated site, whereby adjacent through-hole conductors may be short-circuited with each other. Further, when the through-hole conductor is exfoliated from the inner wall of the through-hole, disconnection may occur in the through-hole conductor. For this reason, electrical reliability of the printed circuit board is liable to decrease.

SUMMARY OF THE INVENTION

The present invention provides a printed circuit board and a mount structure thereof that meet the demand for improving the electrical reliability, as well as methods of producing these.

A printed circuit board of the present invention includes a base body, a through-hole that penetrates through the base body in a thickness direction, and a through-hole conductor that covers an inner wall of the through-hole. The base body has a fiber layer including a plurality of glass fibers and a first resin that covers the plurality of glass fibers. The glass fibers have a groove-shaped concavity on a surface exposed to the inner wall of the through-hole. The concavity is filled with a part of the through-hole conductor.

Also, a mount structure of the present invention includes a printed circuit board described above and an electronic component mounted on the printed circuit board and electrically connected to the through-hole conductor.

A method of producing a printed circuit board of the present invention includes a step of forming a base body having a fiber layer including a plurality of glass fibers and a first resin that covers the plurality of glass fibers; a step of forming in the base body a through-hole having a groove-shaped concavity on a surface of the glass fibers exposed to an inner wall by spraying fine particles towards the base body using the sandblast method; and a step of covering the inner wall of the through-hole with a through-hole conductor.

Also, a method of producing a mount structure of the present invention includes a step of electrically connecting an electronic component to a printed circuit board fabricated by the production method described above.

According to the printed circuit board of the present invention, the glass fibers of the base body have the groove-shaped concavity on the surface exposed to the inner wall of the through-hole, and the concavity is filled with a part of the through-hole conductor, so that exfoliation between the glass fibers and the through-hole conductor can be reduced. Therefore, disconnection of the through-hole conductor can be reduced, and further, a printed circuit board being excellent in electrical reliability can be obtained.

According to the method of producing a printed circuit board of the present invention, the through-hole is formed in the base body by spraying fine particles towards the base body using the sandblast method. Therefore, on the inner wall of the through-hole, exfoliation between the first resin and the glass fibers can be reduced, and further, a printed circuit board being excellent in electrical reliability can be fabricated.

BRIEF DESCRIPTION OF THE DRAWINGS

FIG. 4B shows a result of evaluation of the reliability in the copper-clad laminate plate in which the through-hole conductor has been formed after forming the through-hole by the sandblast method or a drilling treatment; and FIG. 5 shows photographs of crushed particles or spherical particles and photographs obtained by capturing an image of the cross-section cut along the thickness direction before forming the through-hole conductor in the copper-clad laminate plate in which the through-hole has been formed by the sandblast method using the crushed particles or spherical particles by using a field emission type microscope.

DESCRIPTION OF THE PREFERRED EMBODIMENTS

Hereafter, a mount structure including a printed circuit board according to one embodiment of the present invention will be described in detail with reference to the attached drawings.

Figure 1A:
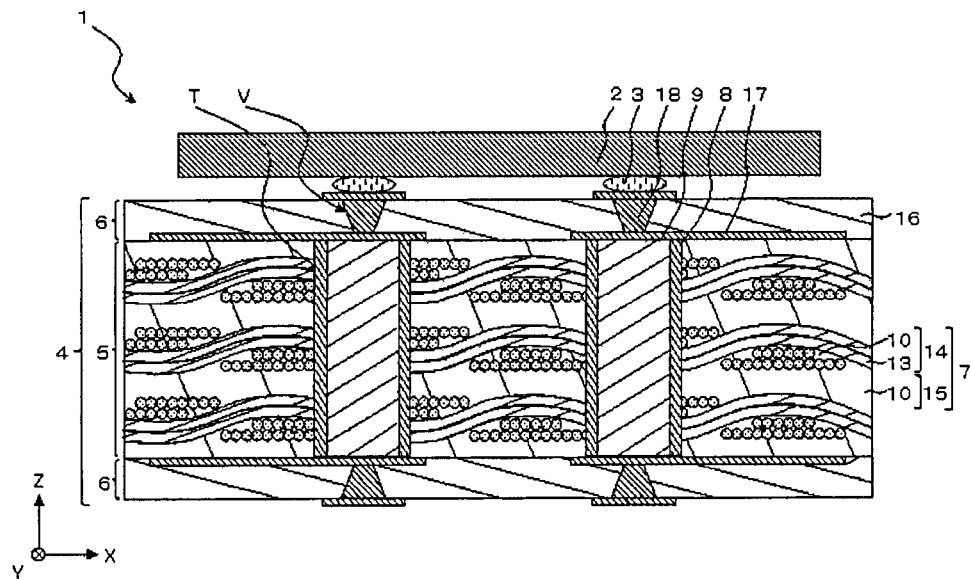
FIG. 1A is a cross-sectional view along the thickness direction of a mount structure according to one embodiment of the present invention.

The mount structure 1 shown in FIG. 1A is used in electronic apparatus, for example, various audio-visual apparatus, home electronic apparatus, communication apparatus, computer apparatus, or peripheral apparatus thereof. This mount structure 1 includes an electronic component 2 and a printed circuit board 4 having a flat plate shape on which the electronic component 2 is flip-chip-mounted through the intermediary of a bump 3.

The electronic component 2 is, for example, a semiconductor element such as an IC or a LSI. The matrix of the electronic component 2 is formed, for example, of a semiconductor material such as silicon, germanium, gallium arsenic, gallium arsenic phosphorus, gallium nitride, or silicon carbide. The thickness of this electronic component 2 is, for example, 0.1 mm or more and 1 mm or less.

The bump 3 is formed, for example, of an electrically conductive material such as a solder containing lead, tin, silver, gold, copper, zinc, bismuth, indium, aluminum, or the like.

The printed circuit board 4 includes a core substrate 5 having a flat plate shape and a pair of interconnect layers 6 formed on both sides of the core substrate 5. The thickness of this printed circuit board 4 is, for example, 0.2 mm or more and 1.2 mm or less. Also, the coefficient of thermal expansion of the printed circuit board 4 in the plane direction is preferably larger than the coefficient of thermal expansion of the electronic component 2.

The core substrate 5 aims at establishing an electrical connection between the pair of interconnect layers 6 formed on both sides of the core substrate 5 while enhancing the strength of the printed circuit board 4. The core substrate 5 includes a base body 7 having a flat plate shape in which a plurality of through-holes T penetrating in the thickness direction are formed, a tubular through-hole conductor 8 that covers the inner wall of the plurality of through-holes T, and a columnar insulating body 9 formed in a region surrounded by the through-hole conductor 8.

Figure 1B:
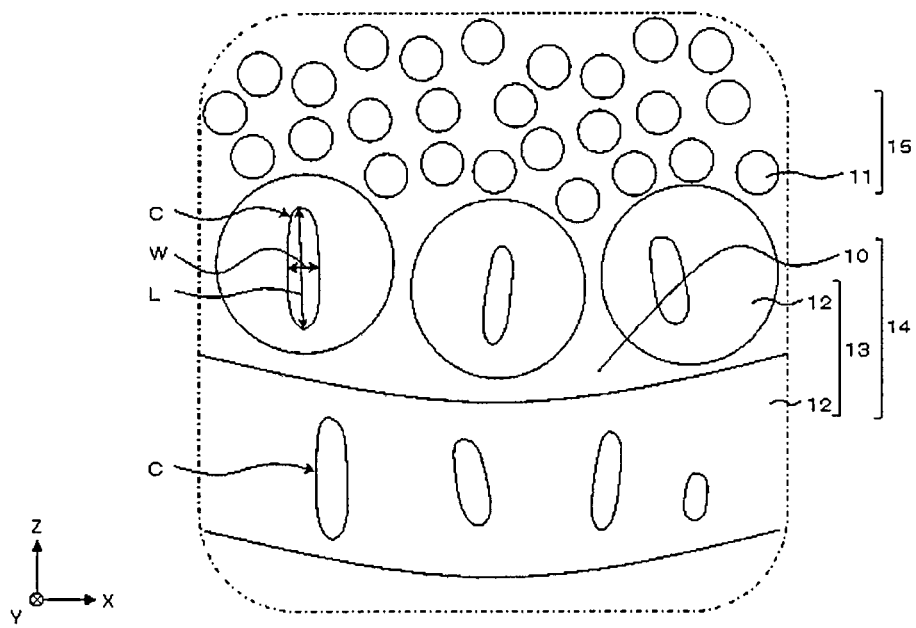
FIG. 1B is an enlarged view of a surface of an inner wall of a through-hole of the mount structure according to one embodiment of the present invention.

The base body 7 is for enhancing the rigidity of the core substrate 5. Referring to FIGS. 1A and 1B, the base body 7 includes a resin 10 (first resin), inorganic insulating particles 11 covered with the resin 10, and a base material 13 having a flat plate shape and made of a plurality of glass fibers 12 that is covered by the resin 10.

In this base body 7, the layer made of the base material 13 and the resin 10 (first resin) disposed between the glass fibers 12 constituting the base material 13 will be referred to as a fiber layer 14. Also, the layer disposed between the fiber layers 14 and made of the resin 10 (second resin) and the inorganic insulating particles 11 without including the glass fibers will be referred to as a resin layer 15. The boundary between the fiber layer 14 and the resin layer 15 is constituted of the interface between the glass fibers 12 constituting the fiber layer 14 and the resin 10 constituting the resin layer 15. Here, the fiber layer 14 may include the inorganic insulating particles 11 between the glass fibers 12.

Also, the thickness of the base body 7 may be, for example, 0.03 mm or more and 1.0 mm or less. The coefficient of thermal expansion of the base body 7 in the plane direction may be, for example, 4 ppm/° C. or more and 15 ppm/° C. or less. The coefficient of thermal expansion of the base body 7 in the thickness direction may be, for example, 11 ppm/° C. or more and 30 ppm/° C. or less. The coefficient of thermal expansion of the base body 7 in the thickness direction may be, for example, 2 time or more and 2.8 times or less as large as the coefficient of thermal expansion of the base body 7 in the plane direction. Young's modulus of the base body 7 may be, for example, 20 GPa or more and 30 GPa or less.

Here, the coefficient of thermal expansion of the base body 7 can be measured by a measuring method in accordance with JIS K7197-1991 using a commercially available TMA apparatus. Also, Young's modulus of the base body 7 can be measured by using Nano Indentor XP/DCM manufactured by MTS Systems Co., Ltd.

The resin 10 contained in the base body 7 may be formed, for example, of a resin material such as epoxy resin, bismaleimidetriazine resin, cyanate resin, poly(p-phenylenebenzobisoxazole) resin, aramid resin, polyimide resin, aromatic liquid crystal polyester resin, polyetheretherketone resin, or polyetherketone resin. The coefficient of thermal expansion of this resin 10 in the plane direction and in the thickness direction may be, for example, 20 ppm/° C. or more and 50 ppm/° C. or less. Young's modulus of the resin 10 may be, for example, 3 GPa or more and 10 GPa or less.

The inorganic insulating particles 11 covered with the resin 10 reduce the coefficient of thermal expansion of the base body 7 and enhance the rigidity of the base body 7. The inorganic insulating particles 11 contain an inorganic insulating material such as aluminum hydroxide, magnesium hydroxide, or silicon oxide. Among these, the inorganic insulating particles 11 preferably contain silicon oxide whose characteristics such as the coefficient of thermal expansion and Young's modulus are close to those of glass fibers. As a result of this, the coefficient of thermal expansion and Young's modulus of the resin layer 15 can be brought closer to the coefficient of thermal expansion and Young's modulus of the fiber layer 14. When the inorganic insulating particles 11 contain silicon oxide, the inorganic insulating particles 11 preferably contain silicon oxide, for example, at 65 wt % or more and 100 wt % or less. In addition to silicon oxide, the inorganic insulating particles 11 may contain aluminum oxide, magnesium oxide, calcium oxide, aluminum nitride, aluminum hydroxide, calcium carbonate, or the like.

The shape of the inorganic insulating particles 11 may be, for example, spherical. The particle size of the inorganic insulating particles 11 may be, for example, 0.5 μm or more and 5.0 μm or less. The coefficient of thermal expansion of the inorganic insulating particles 11 in each direction may be, for example, 2.7 ppm/° C. or more and 6 ppm/° C. or less. Young's modulus of the inorganic insulating particles 11 may be, for example, 70 GPa or more and 85 GPa or less. Here, the inorganic insulating particles 11 may be made of glass fibers that have been finely cut to have a particulate form.

Also, the content of the inorganic insulating particles 11 in the resin layer 15 is preferably, for example, 40 vol % or more and 75 vol % or less. When the content of the inorganic insulating particles 11 is 40 vol % or more, the coefficient of thermal expansion and Young's modulus of the resin layer 15 can be brought closer to the coefficient of thermal expansion and Young's modulus of the fiber layer 14. Also, when the content of the inorganic insulating particles 11 is 75 vol % or less, the adhesion strength between the inorganic insulating particles 11 and the resin 10 located on the inner wall of the through-hole T can be enhanced, whereby the exfoliation between the inorganic insulating particles 11 and the resin 10 can be reduced, and further the exfoliation between the through-hole conductor 8 and the resin layer 15 can be reduced.

Here, the particle size of the inorganic insulating particles 11 can be measured by observing a cross-section of the base body 7 with a field emission type electron microscope, measuring the maximum diameter of each particle, and calculating an average value thereof. Also, the content (vol %) of the inorganic insulating particles 11 in the resin layer 15 can be measured by observing a cross-section of the resin layer 15 with a field emission type electron microscope, measuring the area ratio (area %) occupied by the inorganic insulating particles 11 relative to the resin layer 15, and calculating an average value thereof which is regarded as the content (vol %).

The base material 13 covered with the resin 10 enhances the rigidity of the base body 7 and reduces the coefficient of thermal expansion of the base body 7 in the plane direction. The base material 13 may be formed, for example, of a woven cloth (glass cloth) in which a plurality of glass fibers 12 are woven longitudinally and laterally. Here, as the base material 13, a non-woven cloth may be used, or it is possible to use a material in which a plurality of glass fibers 12 are arranged so that the longitudinal directions thereof will be parallel to each other.

The glass fibers 12 contained in the base material 13 may be, for example, fibers made of glass such as T glass, S glass, or E glass. The diameter of the cross-section perpendicular to the longitudinal direction of the glass fibers 12 may be, for example, 4 μm or more and 9 μm or less. The coefficient of thermal expansion of the glass fibers 12 in the longitudinal direction and in the width direction may be, for example, 2.5 ppm/° C. or more and 6 ppm/° C. or less. Young's modulus of the glass fibers 12 may be, for example, 70 GPa or more and 85 GPa or less.

On the other hand, the through-hole conductor 8 bonded to the inner wall of the through-hole T establishes electrical connection between the interconnect layers 6 above and below the core substrate 5. The through-hole conductor 8 may be formed, for example, of an electrically conductive material such as copper, aluminum, or nickel and, among these, the through-hole conductor 8 is preferably formed of copper, which has a high electric conductivity. The length of this through-hole conductor 8 from the inner wall of the through-hole T to the insulating body 9 is preferably 3 μm or more and 20 μm or less. The coefficient of thermal expansion of the through-hole conductor 8 in the penetration direction and in the width direction may be, for example, 16 ppm/° C. or more and 25 ppm/° C. or less. Young's modulus of the through-hole conductor 8 is preferably, for example, 60 GPa or more and 210 GPa or less. Here, the coefficient of thermal expansion of copper is about 18 ppm/° C. Also, the coefficient of thermal expansion and Young's modulus of the through-hole conductor 8 can be measured in the same manner as those of the base body 7.

The insulating body 9 formed in the region surrounded by the through-hole conductor 8 forms a supporting surface for supporting the via conductor 18 described later. The insulating body 9 may be formed, for example, of a resin material such as polyimide resin, acrylic resin, epoxy resin, cyanate resin, fluoro resin, silicone resin, polyphenyleneether resin, or bismaleimidetriazine resin.

On the other hand, on both sides of the core substrate 5, a pair of interconnect layers 6 are formed as described above. The interconnect layer 6 contains an insulating layer 16 laminated on the base body 7 and having a via hole V formed therein that penetrates in the thickness direction, an electrically conductive layer 17 formed on the base body 7 or on the insulating layer 16, and a via conductor 18 that is formed in the via hole V and electrically connected to the electrically conductive layer 17.

The insulating layer 16 not only functions as a supporting member that supports the electrically conductive layer 17 but also functions as an insulating member that prevents short-circuiting of the electrically conductive layers 17 with each other. The insulating layer 16 contains a resin and inorganic insulating particles covered with the resin. The thickness of this insulating layer 16 is preferably, for example, 5 μm or more and 40 μm or less. The coefficient of thermal expansion of the insulating layer 16 in the plane direction and in the thickness direction is preferably, for example, 15 ppm/° C. or more and 45 ppm/° C. or less. Young's modulus of the insulating layer 16 is preferably, for example, 5 GPa or more and 40 GPa or less. Here, the coefficient of thermal expansion and Young's modulus of the insulating layer 16 can be measured in the same manner as those of the base body 7.

The resin contained in the insulating layer 16 may be formed, for example, of a resin material such as epoxy resin, bismaleimidetriazine resin, cyanate resin, poly(p-phenylenebenzobisoxazole) resin, aramid resin, polyimide resin, aromatic liquid crystal polyester resin, polyetheretherketone resin, or polyetherketone resin.

The inorganic insulating particles contained in the insulating layer 16 may be those similar to the inorganic insulating particles 11 contained in the base body 7.

The electrically conductive layer 17 functions, for example, as an interconnect for grounding, an interconnect for electric power supply, or an interconnect for signals. The electrically conductive layer 17 may be formed, for example, of a metal material such as copper, silver, gold, aluminum, nickel, or chromium. The thickness of this electrically conductive layer 17 may be, for example, 3 μm or more and 20 μm or less. The coefficient of thermal expansion of the electrically conductive layer 17 in the plane direction and in the thickness direction may be, for example, 5 ppm/° C. or more and 25 ppm/° C. or less. Young's modulus of the electrically conductive layer 17 may be, for example, 50 GPa or more and 250 GPa or less.

The via conductor 18 connects the electrically conductive layers 17, which are spaced apart from each other in the thickness direction, with each other. The via conductor 18 may be formed, for example, to have a tapered shape such that the width becomes smaller as it goes towards the core substrate 5. The via conductor 18 may be formed, for example, of an electrically conductive material such as copper, silver, gold, aluminum, nickel, or chromium.

By the way, the glass fibers 12 have a smaller coefficient of thermal expansion than the through-hole conductor 8. Therefore, when heat is applied to the printed circuit board 4, a thermal stress is liable to be applied between the glass fibers 12 and the through-hole conductor 8.

On the other hand, in the printed circuit board 4 of the present embodiment, as shown in FIG. 1B, the glass fibers 12 of the fiber layer 14 have a groove-shaped (elongate shape)

concavity C on the surface exposed to the inner wall of the through-hole T (surface parallel to the penetration direction of the through-hole T). The inside of the concavity C is filled with a part of the through-hole conductor 8. Here, since the concavity C has a groove shape, the property of filling the concavity C with the through-hole conductor 8 can be enhanced, whereby the anchoring effect between the concavity C and the through-hole conductor 8 can be enhanced. Therefore, the bonding strength between the glass fibers 12 and the through-hole conductor 8 can be enhanced, and the exfoliation between the glass fibers 12 and the through-hole conductor 8 can be reduced. As a result of this, disconnection of the through-hole conductor 8 can be reduced, and further a printed circuit board 4 being excellent in electrical reliability can be obtained.

The length in the longitudinal direction L of this groove-shaped concavity C is preferably 1.2 times or more and 2.5 times or less as large as the length in the width direction W. When the length in the longitudinal direction L is 1.2 times or more as large as the length in the width direction W, the property of filling the concavity C with the through-hole conductor 8 can be enhanced. Also, when the length in the longitudinal direction L is 2.5 times or less as large as the length in the width direction W, the length in the width direction W can be restrained from becoming too small, and the anchoring effect to the through-hole conductor 8 can be ensured. Here, the length in the longitudinal direction L of the concavity C may be, for example, 3 µm or more and 8 µm or less. The length in the width direction W of the concavity C may be, for example, 2 µm or more and 5 µm or less. The depth of the concavity C may be, for example, 0.5 µm or more and 3 µm or less.

Also, as shown in FIG. 1B, the concavity C preferably has a groove shape that goes along the thickness direction of the base body 7. As a result of this, in the glass fibers 12 having a smaller thermal expansion amount in the plan view as compared with the through-hole conductor 8, an anchoring effect in the circumferential direction of the through-hole T is produced, whereby the bonding strength between the inner wall of the through-hole T and the through-hole conductor 8 can be enhanced.

The arithmetic average roughness (Ra) of the surface of the glass fibers 12 that is exposed to the inner wall of the through-hole T may be, for example, 0.3 µm or more and 3 µm or less. Here, the arithmetic average roughness of the surface of the glass fibers 12 that is covered with the resin 10 (the surface that is not exposed to the inner wall of the through-hole T) may be, for example, 0.1 µm or less, and is smaller than the arithmetic average roughness of the surface of the glass fibers 12 that is exposed to the inner wall of the through-hole T. This arithmetic average roughness of the surface of the glass fibers 12 that is covered with the resin 10 may be, for example, 10% or more and 50% or less of the arithmetic average roughness of the surface of the glass fibers 12 that is exposed to the inner wall of the through-hole T.

In this manner, the above-described mount structure 1 exhibits a desired function by driving or controlling the electronic component 2 on the basis of the electric power source or signals supplied through the intermediary of the printed circuit board 4.

Next, a method of producing the above-described mount structure 1 will be described with reference to FIGS. 2A to 2D.

(Preparation of Base Body)

Figure 2A:
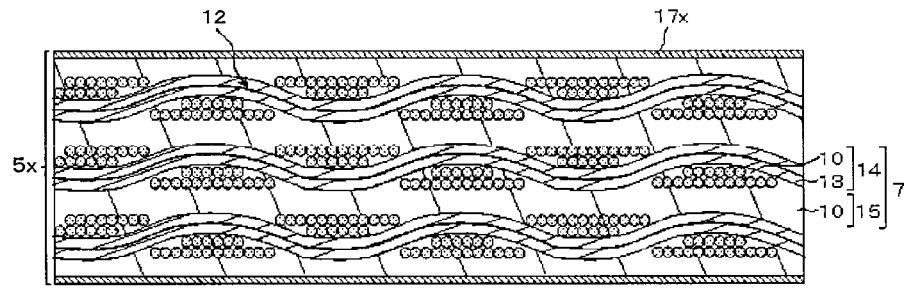
FIGS. 2A to 2D are cross-sectional views cut along the thickness direction for describing the steps for producing the mount structure shown in FIG. 1A.

(1) As shown in FIG. 2A, a copper-clad laminate plate x made of a base body 7 and copper foils 17x disposed above and below the base body 7 is prepared. Specifically, for example, the following procedure is taken.

First, a varnish containing an uncured resin 10 and inorganic insulating particles 11 is prepared, and a base material 13 is impregnated with the varnish to form a resin sheet. In impregnating the base material 13 with the varnish in this manner, the inorganic insulating particles 11 hardly penetrate between the glass fibers 12 of the base material 13 and hence are concentrated in a region outside of the base material 13 (region that will be the resin layer 15). Here, the uncured state is a state of A-stage or B-stage in accordance with ISO 472: 1999.

Next, the resin sheets are laminated to form a base body precursor, and copper foils 17x are laminated above and below the base body precursor to form a laminate body. Thereafter, the laminate body is heated and pressed in the thickness direction, whereby the resin 10 is thermally cured to form a base body 7, and the above-described copper-clad laminate plate 5x is fabricated. In forming the base body 7 in this manner, the base material 13 of the resin sheet and the resin between the glass fibers 12 thereof will be a fiber layer 14, and the regions of adjacent resin sheets outside of the base material 13 are bonded with each other to form a resin layer 15.

(Forming a Through-Hole)

Figure 2B:
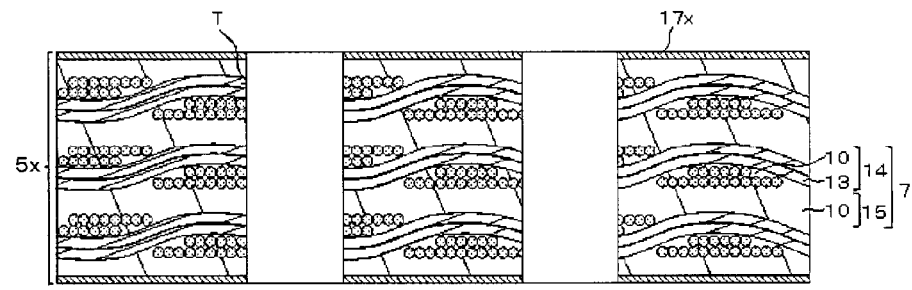

(2) As shown in FIG. 2B, a through-hole T is formed in the copper-clad laminate plate 5x by using the sandblast method. Specifically, for example, the following procedure is taken.

First, on both surfaces of the copper-clad laminate plate 5x, a resist is formed having an opening at the site where the through-hole T is to be formed. This resist can be formed, for example, by exposing and developing a photosensitive resin. Next, by spraying fine particles onto one principal surface of the copper-clad laminate plate 5x from the nozzle of a sandblast apparatus, one part of the through-hole T (not penetrating) is formed through the intermediary of the opening of the resist.

Next, by spraying fine particles onto the other principal surface of the copper-clad laminate plate 5x, a through-hole T that penetrates through the base body 7 is formed. Here, the through-hole T that penetrates through the base body 7 may be formed by spraying fine particles only onto the one principal surface of the copper-clad laminate plate 5x.

Next, the resist is removed, for example, with 1 to 3 wt % sodium hydroxide solution or the like. Next, by washing the inner wall of the through-hole T with water at a high pressure, the remaining fine particles and process chips of the through-hole T are removed.

When the sandblast method is used in this manner, the through-hole T is formed by spraying fine particles, so that the stress and heat (friction heat of a drilling process) applied to the boundary between the glass fibers 12 and the resin 10 can be reduced as compared with a drilling process. Further, when the sandblast method is used, the heat applied to the boundary between the glass fibers 12 and the resin 10 can be reduced as compared with laser processing. Therefore, when the sandblast method is used, exfoliation between the glass fibers 12 and the resin 10 can be reduced, so that the interval can be made shorter while reducing the short-circuiting of adjacent through-hole conductors 8 with each other, and moreover, the interconnect density of the printed circuit board 4 can be raised. Further, exfoliation between the glass fibers 12 and the resin 10 can be reduced.

Also, when the sandblast method is used, even in the case in which the content of the inorganic insulating fillers 11 in the base body 7 is increased, the drill is not abraded as in the case of a drilling process, and also the through-hole T can be formed more easily than by the laser processing. Therefore, when the content of the inorganic insulating fillers 11 in the base body 7 is high, the through-hole T can be formed efficiently by using the sandblast method.

In particular, the content of the inorganic insulating particles 11 in the resin layer 15 of the base body 7 to which the fine particles are to be sprayed is preferably 40 vol % or more and 75 vol % or less. By setting the content of the inorganic insulating particles 11 to be 40 vol % or more, the cuttability of the resin layer 15 by the sandblast method can be enhanced. Also, by setting the content of the inorganic insulating particles 11 to be 75 vol % or less, drop-off of the inorganic insulating particles 11 from the inner wall of the through-hole T can be reduced in forming the through-hole T, and decrease in the close adhesion strength between the inner wall of the through-hole T and the through-hole conductor 8 due to air bubbles remaining in the recesses caused by the drop-off of the particles can be reduced.

Also, since the sandblast is carried out using a resist, a plurality of through-holes T can be processed simultaneously by spraying fine particles in a wide range, so that the through-hole T can be efficiently formed as compared with the drilling process or the laser processing.

Since the through-hole T and the concavity C are formed by the sandblast method as described above, the sandblast method can be carried out under the following conditions.

First, the sandblast is carried out by a dry blast. As a result thereof, resistance to the fine particles is smaller as compared with a wet blast, so that the cuttability of the through-hole T is enhanced, and the amount of process chips remaining at the time of cutting is reduced, whereby the inhibition of cutting caused by the process chips can be reduced.

On the other hand, the fine particles sprayed by the sandblast may be, for example, spherical fine particles (spherical particles) or fine particles having a crushed shape (crushed particles). The fine particles may be formed, for example, by using an inorganic insulating material such as glass, alumina, silicon carbide, or zirconia.

Among these, the fine particles sprayed by the sandblast are preferably fine particles having a crushed shape (crushed particles) made of an inorganic insulating material having a larger hardness than glass. As a result of this, the glass fibers 12 exposed on the inner wall of the through-hole T can be efficiently cut by an acute tip end of the crushed particles harder than the glass fibers 12. For this reason, the through-hole T can be efficiently formed while reducing the stress applied between the glass fibers 12 and the resin 10. Also, since the surface of the glass fibers 12 exposed on the inner wall of the through-hole T is partially cut by the acute tip end of the crushed particles harder than the glass fibers 12, a groove-shaped concavity C that goes along the thickness direction can be formed.

The inorganic insulating material having a larger hardness than glass in this manner may be, for example, alumina, silicon carbide, zirconia, or the like and, among these, alumina is preferably used. Here, as the hardness, a Vickers hardness can be used.

Also, the fine particles are preferably such that the maximum diameter of the crushed particles is 3 µm or more and 40 µm or less, more preferably 10 µm or more and 30 µm or less. By setting the maximum diameter of the crushed particles to be 3 µm or more, the cuttability by the crushed particles can be enhanced, and the through-hole T can be easily formed. Also, by setting the maximum diameter of the crushed particles to be 40 µm or less, the through-hole T can be formed without clogging of the hole by the crushed particles.

Also, the pressure at which the fine particles are sprayed is preferably, for example, 0.15 MPa or more and 0.22 MPa or less. By setting the pressure to be 0.15 MPa or more, the glass fibers 12 in the through-hole T can be cut and processed efficiently. Also, by setting the pressure to be 0.22 MPa or less, the processing can be carried out so that the resin 10 on the inner wall of the through-hole T may not be excessively cut by collision of the crushed particles with each other.

Also, the amount of spraying of the fine particles is preferably 30 g/min or more and 200 g/min or less. By setting the amount of spraying to be 30 g/min or more, the glass fibers 12 in the through-hole T can be cut and processed efficiently. Also, by setting the amount of spraying to be 200 g/min or less, the processing can be carried out so that the resin 10 on the inner wall of the through-hole T may not be excessively cut by collision of the crushed particles with each other.

Also, the number of times (scanning times) of spraying the fine particles for one through-hole T is set in accordance with the thickness of the base body 7. For example, when the thickness of the core substrate 5 is 40 µm or more and 400 µm or less, the number of times may be, for example, 2 or more and 20 or less.

Here, it is preferable that the inner wall of the through-hole T formed by the sandblast method is not subjected to a desmearing treatment. When the through-hole T is formed by the sandblast method, the heat applied to the inner wall of the through-hole T can be reduced and the residue of carbonized resin can be reduced as compared with the drilling process or the laser processing. Also, since the bond between the molecules is physically cut, the reaction activity of the surface of the resin 10 exposed to the inner wall of the through-hole T can be enhanced. Also, as described above, an anchoring effect to the through-hole conductor 8 is produced by the concavity C of the glass fibers 12 exposed to the inner wall of the through-hole T.

Therefore, even if the desmearing treatment is not carried out, the bonding strength between the inner wall of the through-hole T and the through-hole conductor 8 can be enhanced. By not performing the desmearing treatment in this manner, exposure of the side surface of the glass fibers 12 to a great extent caused by selective etching of only the resin 10 is reduced, and the exfoliation between the resin 10 and the glass fibers 12 can be reduced.

(Forming a Through-Hole Conductor)

Figure 2C:
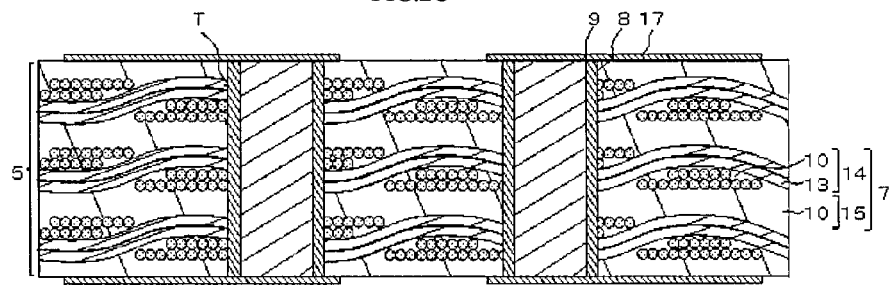

(3) As shown in FIG. 2C, a through-hole conductor 8, an insulating body 9, and an electrically conductive layer 17 are formed in the base body 7, so as to fabricate a core substrate 5. Specifically, the following procedure is taken.

First, an electrically conductive material is bonded to the inner wall of the through-hole T by successively carrying out the non-electrolytic plating method and the electrolytic plating method, so as to form a tubular through-hole conductor 8. At this time, the concavity C of the inner wall of the through-hole T is filled with the electrically conductive material. Here, since the concavity C has a groove shape, remaining of the air bubbles in the concavity C at the time of bonding the electrically conductive material is reduced, and the property of filling the concavity C with the electrically conductive material can be enhanced.

Next, the region surrounded by the tubular through-hole conductor 8 is filled with a resin material or the like, so as to form an insulating body 9. Next, after an electrically conductive material is bonded to the exposed parts of the insulating body 9, the copper foil 17x is patterned by a photolithography technique, etching, or the like conventionally known in the art, so as to form an electrically conductive layer 17. Here, for the bonding of the electrically conductive material, the vapor deposition method, the CVD method, or the sputtering method may be used.

In the above-described manner, the core substrate 5 can be fabricated.

(Forming an Interconnect Layer)

Figure 2D:
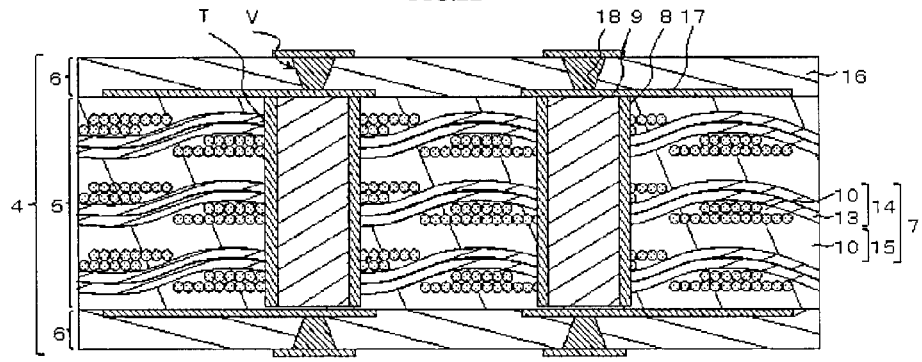

(4) As shown in FIG. 2D, a pair of interconnect layers 6 are formed on both sides of the core substrate 5, thereby to fabricate a printed circuit board 4. Specifically, the following procedure is taken.

First, an uncured resin is placed on the electrically conductive layer 17. While heating the resin for fluidization and close adhesion, the resin is cured by further heating, so as to form an insulating layer 16 on the electrically conductive layer 17. Next, a via hole V is formed by laser processing, and at least a part of the electrically conductive layer 17 is exposed within the via hole V. By forming the via hole V by laser processing, damage of the electrically conductive layer 17 exposed within the via hole V can be reduced as compared with the sandblast method. Next, a via conductor 18 is formed in the via hole V, for example, by the semi-additive method, the subtractive method, the full-additive method, or the like, and an electrically conductive layer 17 is formed on the top surface of the insulating layer 16.

In the above-described manner, the printed circuit board 4 can be fabricated. Here, by repeating the present steps, the insulating layer 16 and the electrically conductive layer 17 can be formed into multiple layers in the interconnect layer 6.

(Mounting of an Electronic Component)

(5) A bump 3 is formed on the top surface of the uppermost electrically conductive layer 17, and an electronic component 2 is flip-chip mounted on the printed circuit board 4 through the intermediary of the bump 3.

In the above-described manner, the mount structure 1 shown in FIG. 1A can be fabricated.

The present invention is not limited to the above-described embodiments, so that various modifications, improvements, combinations, and the like can be made within a range that does not depart from the gist of the present invention.

For example, in the above-described embodiment, description has been given by raising, as an example, a construction in which a semiconductor element is used as the electronic component; however, a capacitor or the like can be used as the electronic component.

Also, in the above-described embodiment, description has been given by raising, as an example, a construction in which an electronic component is flip-chip mounted on the printed circuit board; however, the electronic component may be mounted on the printed circuit board by wire bonding, or alternatively the electronic component may be mounted in the inside of the printed circuit board.

Also, in the above-described embodiment, description has been given by raising, as an example, a construction in which the interconnect layer includes one insulating layer; however, the interconnect layer may include any number of insulating layers.

Also, in the above-described embodiment, description has been given by raising, as an example, a construction in which the base body includes three fiber layers; however, the base body may include any number of fiber layers.

Also, in the above-described embodiment, description has been given by raising, as an example, a construction in which the first resin of the fiber layer and the second resin of the resin layer are identical; however, the first resin of the fiber layer and the second resin of the resin layer may be different from each other.

Also, in the above-described embodiment, description has been given by raising, as an example, a construction in which a copper foil is used in the step of (1); however, instead of the copper foil, for example, a metal foil made of a metal material such as iron nickel alloy or iron nickel cobalt alloy may be used.

EXAMPLES

Hereafter, the present invention will be described in detail by raising Examples; however, the present invention is not limited by the following Examples, so that changes and embodiments within the range that does not depart from the gist of the present invention are all comprised within the scope of the present invention.

<Comparison of Through-Hole Processing Methods>

(Evaluation Method)

A copper-clad laminate plate was fabricated in which a copper foil had been laminated above and below a base body, and through-holes were formed by the sandblast method, a drilling process, or laser processing (355 nmUV). Next, a through-hole conductor was formed on the inner wall of the through-holes by using the non-electrolytic plating method and the electrolytic plating method. Thereafter, the copper-clad laminate plate before and after forming the through-hole conductor was cut in the thickness direction, and the cut surface was observed by using a field emission type electron microscope or a metal microscope.

Also, after through-holes having a different pitch were formed using the sandblast method or a drilling process, a pressure cooker bias test (PCBT) which is a high-temperature high-humidity bias test and a high-temperature high-humidity bias (THB) test were carried out on the copper-clad laminate plate in which the through-hole conductor had been formed, so as to evaluate the insulation reliability between the through-hole conductors. Here, the conditions for PCBT are 130° C., 85% RH, and an applied bias voltage of 5V, and the conditions for the THB test are 85° C., 85% RH, and an applied bias voltage of 5V.

(Conditions for Fabricating the Copper-Clad Laminate Plate)

First, a resin sheet containing an uncured epoxy resin (resin), a silica filler (inorganic insulating particles), and a glass cloth (base material) was prepared. Here, the resin sheet contains the silica filler at a ratio of 60 vol %.

Next, four layers of the resin sheets were laminated, and a copper foil was laminated on the outermost layer, so as to form a laminate body.

Next, the laminate body was heated and pressed in the thickness direction under the conditions with temperature: 220° C., pressure: 3 MPa, and time: 90 minutes, so as to fabricate the above-described copper-clad laminate plate.

(Through-Hole Processing Conditions)

The sandblast method was carried out under the conditions with an amount of spraying fine particles: 50 g/min, pressure for spraying the fine particles: 0.15 MPa, shape of the fine particles: crushed particles, particle size of the fine particles: 26 μm, and material of the fine particles: alumina.

The drilling process was carried out under the conditions with spindle: 30 krpm and chip load: 3 μm/rev.

The laser processing was carried out under the conditions with wavelength: 355 nm, frequency: 30 kHz, beam mode: Gaussian beam mode, and speed: 91.6 mm/sec.

(Results)

Figure 3A:
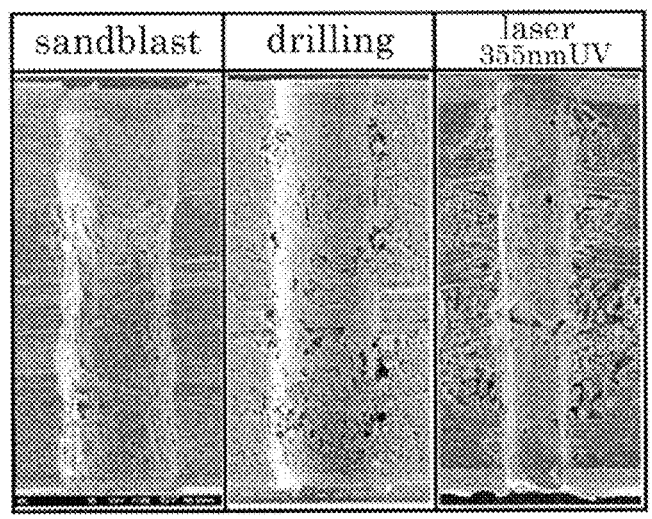
FIG. 3A shows a photograph obtained by capturing an image of the cross-section cut along the thickness direction before forming a through-hole conductor in a copper-clad laminate plate in which the through-hole has been formed by the sandblast method, a drilling treatment, or a laser treatment in an Example of the present invention by using a field emission type microscope or a metal microscope.
Figure 3B:
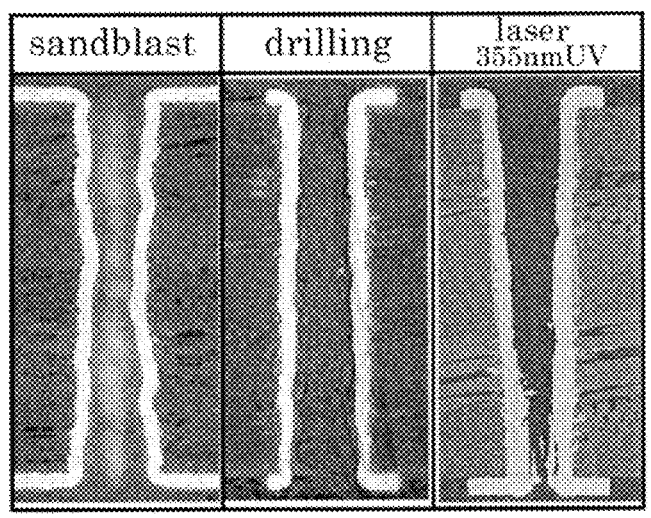
FIG. 3B shows a photograph obtained by capturing an image of the cross-section cut along the thickness direction after forming the through-hole conductor in the copper-clad laminate plate of FIG. 3A by using a field emission type microscope or a metal microscope.
Figure 4A:
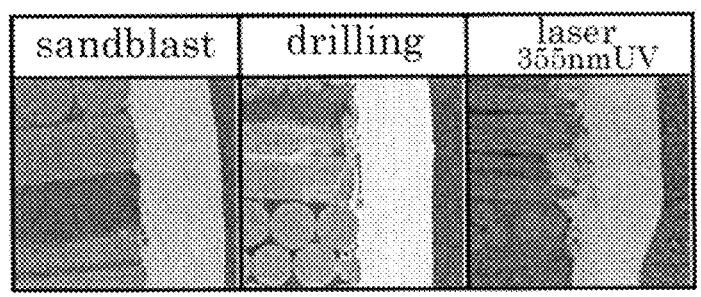
FIG. 4A shows a photograph of a portion corresponding to one part of FIG. 3B enlarged by using a field emission type microscope.

As shown in FIGS. 3A, 3B, and 4A, in the copper-clad laminate plate in which the through-holes had been formed by the drilling process and laser processing, the through-hole conductor had penetrated between the glass cloth and the resin; however, in the copper-clad laminate plate in which the through-holes had been formed by the sandblast method, the glass cloth and the resin were in close adhesion, and penetration of the through-hole conductor was not seen.

As shown in FIG. 4B, in the copper-clad laminate plate in which the through-holes had been formed by a drilling process, an electrical defect was seen when the pitch of the through-holes was set to be 100 μm; however, an electrical defect was not seen in the copper-clad laminate plate in which the through-holes were formed by the sandblast method.

(Comparison of the Sprayed Particle Shape)
(Evaluation Method)

A copper-clad laminate plate was fabricated in which a copper foil had been laminated above and below a base body and, after through-holes were formed by spraying crushed particles or spherical particles in the sandblast method, the copper-clad laminate plate was cut in the thickness direction, and the cut surface was observed using a field emission type electron microscope.

(Conditions for Fabricating Copper-Clad Laminate Plate)

A copper-clad laminate plate was fabricated in the same manner as in the comparison of the above-described through-hole processing.

(Through-Hole Processing Conditions)

The spherical particles are under the conditions with material: magnetic material powder Fe—Si—B—Cr and particle size: 11 μm. The other conditions are the same as those of the comparison of the above-described through-hole processing.

(Results)

As shown in FIG. 5, as compared with the case of using the spherical particles, the processability of the through-hole was good when the crushed particles were used, and also a concavity had been formed on the side surface and the end surface of the glass fibers that had been exposed to the through-hole.

What is claimed is:

1. A printed circuit board comprising a base body, a through-hole that penetrates through the base body in a thickness direction, and a through-hole conductor that covers an inner wall of the through-hole, wherein
    the base body has a fiber layer comprising a plurality of glass fibers and a first resin that covers the plurality of glass fibers,
    the glass fibers have a groove-shaped concavity on a surface exposed to the inner wall of the through-hole, and
    the concavity is filled with a part of the through-hole conductor.

2. The printed circuit board according to claim 1, wherein a longitudinal direction of the concavity is along the thickness direction of the base body.

3. The printed circuit board according to claim 1, wherein a length of the concavity in a longitudinal direction thereof is 1.2 times or more and 2.5 times or less as large as a length of the concavity in a width direction thereof.

4. The printed circuit board according to claim 1, wherein the glass fibers have an arithmetic average roughness of 0.3 μm or more and 3 μm or less on the surface exposed to the inner wall of the through-hole.

5. A mount structure comprising a printed circuit board according to claim 1 and an electronic component mounted on the printed circuit board and electrically connected to the printed circuit board.

6. A method of producing a printed circuit board comprising:
    a step of forming a base body having a fiber layer including a plurality of glass fibers and a first resin that covers the plurality of glass fibers;
    a step of forming in the base body a through-hole having a groove-shaped concavity on a surface of the glass fibers exposed to an inner wall by spraying fine particles towards the base body using the sandblast method; and
    a step of covering the inner wall of the through-hole with a through-hole conductor.

7. The method of producing a printed circuit board according to claim 6, wherein the fine particles are crushed particles.

8. The method of producing a printed circuit board according to claim 7, wherein the fine particles have a hardness larger than that of the glass fibers.

9. The method of producing a printed circuit board according to claim 8, wherein the fine particles comprise alumina, silicon carbide, or zirconia.

10. The method of producing a printed circuit board according to claim 6, wherein the base body further has, on the fiber layer, a resin layer comprising a second resin and inorganic insulating particles covered with the second resin.

11. The method of producing a printed circuit board according to claim 10, wherein the inorganic insulating particles comprise silicon oxide.

12. The method of producing a printed circuit board according to claim 11, wherein the resin layer contains the inorganic insulating particles at a ratio of 40% by volume or more and 75% by volume or less.

13. The method of producing a printed circuit board according to claim 6, wherein the step of covering the inner wall of the through-hole with the through-hole conductor is carried out without carrying out a desmearing treatment on the inner wall of the through-hole after carrying out the step of forming the through-hole in the base body.

14. The method of producing a printed circuit board according to claim 13, wherein the step of covering the inner wall of the through-hole with the through-hole conductor is carried out by the plating method.

15. A method of producing a mount structure comprising a step of electrically connecting an electronic component to a printed circuit board fabricated by the production method according to claim 6.

* * * * *